United States Patent
Pharney et al.

(10) Patent No.: US 7,682,203 B1
(45) Date of Patent: Mar. 23, 2010

(54) COMMUNICATIONS JACKS HAVING CONTACT WIRE CONFIGURATIONS THAT PROVIDE CROSSTALK COMPENSATION

(75) Inventors: Julian Pharney, Indianapolis, IN (US); Brian Fitzpatrick, McKinney, TX (US); David Heckmann, Richardson, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 12/264,498

(22) Filed: Nov. 4, 2008

(51) Int. Cl.
  *H01R 24/00* (2006.01)
(52) U.S. Cl. .................................... 439/676
(58) Field of Classification Search ............... 439/676, 439/941, 404
  See application file for complete search history.

(56) References Cited

U.S. PATENT DOCUMENTS

| | | | |
|---|---|---|---|
| 5,186,647 A | 2/1993 | Denkmann et al. | |
| 5,921,818 A | 7/1999 | Larsen et al. | |
| 5,967,853 A | 10/1999 | Hashim | |
| 6,086,428 A | 7/2000 | Pharney et al. | |
| 6,186,834 B1 | 2/2001 | Arnett et al. | |
| 6,196,880 B1 | 3/2001 | Goodrich et al. | |
| 6,312,290 B1 | 11/2001 | Belopolsky | |
| 6,350,158 B1 | 2/2002 | Arnett et al. | |
| 6,364,694 B1 | 4/2002 | Lien | |
| 6,428,362 B1 * | 8/2002 | Phommachanh | 439/676 |
| 6,443,777 B1 | 9/2002 | McCurdy et al. | |
| 6,464,529 B1 | 10/2002 | Jensen et al. | |
| 6,464,541 B1 * | 10/2002 | Hashim et al. | 439/676 |
| 6,547,604 B2 * | 4/2003 | Arnett et al. | 439/676 |
| 6,558,207 B1 | 5/2003 | Pepe et al. | |
| 6,641,443 B1 * | 11/2003 | Itano et al. | 439/676 |
| 6,786,775 B1 * | 9/2004 | Hanrahan et al. | 439/676 |
| 6,786,776 B2 * | 9/2004 | Itano et al. | 439/676 |
| 7,037,140 B2 * | 5/2006 | Aekins et al. | 439/676 |
| 7,166,000 B2 | 1/2007 | Pharney | |
| 7,186,148 B2 * | 3/2007 | Hashim | 439/676 |
| 7,186,149 B2 * | 3/2007 | Hashim | 439/676 |
| 7,204,722 B2 | 4/2007 | Hashim et al. | |
| 7,220,149 B2 | 5/2007 | Pharney | |
| 7,265,300 B2 * | 9/2007 | Adriaenssens et al. | 174/258 |
| 7,320,624 B2 | 1/2008 | Hashim et al. | |
| 7,427,218 B1 * | 9/2008 | Hashim et al. | 439/676 |
| 7,485,010 B2 * | 2/2009 | Aekins | 439/676 |
| 2001/0018287 A1 | 8/2001 | Reichle | |
| 2001/0021608 A1 | 9/2001 | Borbolla et al. | |
| 2002/0160662 A1 * | 10/2002 | Arnett et al. | 439/676 |

(Continued)

*Primary Examiner*—T C Patel
*Assistant Examiner*—Vladimir Imas
(74) *Attorney, Agent, or Firm*—Myers Bigel Sibley & Sajovec

(57) ABSTRACT

Communications jacks include a housing having a plug aperture that is configured to receive a mating plug that is inserted along a horizontal plug axis and a vertically-oriented wiring board that is mounted substantially normal to the horizontal plug axis. First through fourth contact wires are mounted in the vertically-oriented wiring board, with the first and second contact wires forming a first differential pair of contact wires and the third and fourth contact wires forming a second differential pair of contact wires. At least a portion of the first differential pair of contact wires is positioned between the contact wires of the second differential pair of contact wires, and deflectable portions of the third and fourth contact wires include a crossover. Additionally, the fixed portions of the third and fourth contacts are spaced further apart vertically than are the fixed portions of the first and second contacts.

22 Claims, 8 Drawing Sheets

U.S. PATENT DOCUMENTS

| | | | |
|---|---|---|---|
| 2002/0177365 A1* | 11/2002 | Hyland | 439/676 |
| 2002/0177366 A1* | 11/2002 | Hyland | 439/676 |
| 2003/0129880 A1* | 7/2003 | Arnett et al. | 439/676 |
| 2004/0002267 A1 | 1/2004 | Hatterscheid et al. | |
| 2006/0121793 A1* | 6/2006 | Pharney | 439/676 |
| 2007/0212946 A1* | 9/2007 | Bert et al. | 439/676 |
| 2007/0254529 A1* | 11/2007 | Pepe et al. | 439/676 |

* cited by examiner

▨ LEVEL 1
▨ LEVEL 2
▨ LEVEL 3
▨ LEVEL 4

COMMUNICATIONS JACKS HAVING CONTACT WIRE CONFIGURATIONS THAT PROVIDE CROSSTALK COMPENSATION

FIELD OF THE INVENTION

The present invention relates generally to communications connectors and, more particularly, to crosstalk compensation in communications jacks.

BACKGROUND

In an electrical communications system, it is sometimes advantageous to transmit information signals (e.g., video, audio, data) over a pair of conductors (hereinafter "wire pair" or "conductor pair" or "differential pair") rather than over a single conductor. The conductors may comprise, for example, wires, contacts, wiring board traces, conductive vias, other electrically conductive elements and/or combinations thereof. The signals transmitted on each conductor of the differential pair have equal magnitudes, but opposite phases, and the information signal is embedded as the voltage difference between the signals carried on the two conductors. This transmission technique is generally referred to as "balanced" transmission.

When a signal is transmitted over a conductor, electrical noise from external sources such as lightning, electronic equipment and devices, automobile spark plugs, radio stations, etc. may be picked up by the conductor, degrading the quality of the signal carried by the conductor. With balanced transmission techniques, each conductor in a differential pair often picks up approximately the same amount of noise from these external sources. Because approximately an equal amount of noise is added to the signals carried by both conductors of the differential pair, the information signal is typically not disturbed, as the information signal is extracted by taking the difference of the signals carried on the two conductors of the differential pair, and thus the noise signal may be substantially cancelled out by the subtraction process.

Many communications systems include a plurality of differential pairs. For example, the typical telephone line includes two differential pairs (i.e., a total of four conductors). Similarly, high speed communications systems that are used to connect computers and/or other processing devices to local area networks and/or to external networks such as the Internet typically include four differential pairs. In such systems, channels are formed by cascading plugs, jacks and cable segments (herein, a "channel" refers to the end-to-end connection for the four differential pairs that connect one end device to another end device). In these channels, when a plug mates with a jack, the proximities and routings of the conductors and contacting structures within the jack and/or plug can produce capacitive and/or inductive couplings. Moreover, in the cable segments of these channels four differential pairs are usually bundled together within a single cable, and thus additional capacitive and/or inductive coupling may occur between the differential pairs in each cable. These capacitive and inductive couplings give rise to another type of noise that is called "crosstalk."

"Crosstalk" in a communication system refers to an unwanted signal that appears on the conductors of an "idle" or "victim" differential pair that is induced by a disturbing differential pair. "Crosstalk" includes both near-end crosstalk, or "NEXT", which is the crosstalk measured at an input location corresponding to a source at the same location (i.e., crosstalk whose induced voltage signal travels in an opposite direction to that of an originating, disturbing signal in a different path), as well as far-end crosstalk, or "FEXT", which is the crosstalk measured at the output location corresponding to a source at the input location (i.e., crosstalk whose signal travels in the same direction as the disturbing signal in the different path). Both NEXT and FEXT are undesirable signals that interfere with the information signal.

A "disturbing" differential pair may impart two different types of crosstalk onto another differential pair. The nature of the induced voltage determines which of two types of crosstalk is occurring. The first of these two types of crosstalk is referred to as differential-to-differential crosstalk ($XTLK_{DD}$). It occurs when the induced voltages from the source differential pair that are imparted on both the conductors of the victim differential pair are unequal. Differential-to-differential crosstalk is measured as the ratio of the induced differential voltage on the victim pair to the source or driven differential voltage on the disturbing pair (typically referenced as 1 volt). Differential voltage is defined as the difference between the voltages on the two conductors of the differential pair, i.e., $V_{diff}=V_1-V_2$, where $V_1$ is the voltage on conductor 1 and $V_2$ is the voltage on conductor 2 of the differential pair. Differential-to-differential crosstalk is typically expressed in decibels (dBs) and can be defined as:

$$XTLK_{DD}=20 \log(V_1-V_2)$$

where $V_1$ is the induced voltage on conductor 1 of the victim pair and $V_2$ is the induced voltage on conductor 2 of the victim pair.

The second of the two types of crosstalk is referred to as differential-to-common mode crosstalk ($XTLK_{DC}$). Differential-to-common mode crosstalk occurs when the induced voltage is common to both conductors of the victim differential pair, and hence the victim pair can be viewed as being a single conductor. The voltage that is common to both conductors is called the common mode voltage ($V_{CM}$) and is expressed as the average voltage on the two conductors of the differential pair, i.e., $V_{CM}=(V_1+V_2)/2$. Differential-to-common mode crosstalk is measured as the ratio of the induced common mode voltage on the victim differential pair to the source or driven differential voltage of the disturbing pair. It is also expressed in dBs as:

$$XTLK_{DC}=20 \log((V_1+V_2)/2)$$

where $V_1$ and $V_2$ are as described above. Note that the voltages $V_1$ and $V_2$ can be calculated from the inductive and capacitive coupling parameters between disturbing and victim conductors. Further note that if $V_1=-V_2$, then $V_{CM}=0$ and differential-to-common mode crosstalk is zero. Under this condition, the circuits are considered balanced. This is a desirable condition to minimize a type of crosstalk known as "alien NEXT" (which is described in more detail herein) in the channel.

A variety of techniques may be used to reduce crosstalk in communications systems such as, for example, tightly twisting the paired conductors (which are typically insulated copper wires) in a cable, whereby different pairs are twisted at different rates that are not harmonically related, so that each conductor in the cable picks up approximately equal amounts of signal energy from the two conductors of each of the other differential pairs included in the cable. If this condition can be maintained, then the crosstalk noise may be significantly reduced, as the conductors of each differential pair carry equal magnitude, but opposite phase signals such that the crosstalk added by the two conductors of a differential pair onto the other conductors in the cable tends to cancel out.

While such twisting of the conductors and/or various other known techniques may substantially reduce crosstalk in cables, most communications systems include both cables and communications connectors (i.e., jacks and plugs) that interconnect the cables and/or connect the cables to computer hardware. Unfortunately, the jack and plug configurations that were adopted years ago generally did not maintain the conductors of each differential pair a uniform distance from the conductors of the other differential pairs in the connector hardware. Moreover, in order to maintain backward compatibility with connector hardware that is already in place in existing homes and office buildings, the connector configurations have, for the most part, not been changed. As such, the conductors of each differential pair tend to induce unequal amounts of crosstalk on each of the other conductor pairs in current and pre-existing connectors. As a result, many current connector designs generally introduce some amount of NEXT and FEXT crosstalk.

Pursuant to certain industry standards (e.g., the TIA/EIA-568-B.2-1 standard approved Jun. 20, 2002 by the Telecommunications Industry Association), each jack, plug and cable segment in a communications system may include a total of eight conductors 1-8 that comprise four differential pairs. By convention, the conductors of each differential pair are often referred to as a "tip" conductor and a "ring" conductor. The industry standards specify that, in at least the connection region where the contacts (blades) of a modular plug mate with the contacts of the modular jack (i.e., the plug-jack mating point), the eight conductors are aligned in a row, with the four differential pairs specified as depicted in FIG. 1. As known to those of skill in the art, under the TIA/EIA 568, type B configuration, conductor 5 in FIG. 1 comprises the tip conductor of pair 1, conductor 4 comprises the ring conductor of pair 1, conductor 1 comprises the tip conductor of pair 2, conductor 2 comprises the ring conductor of pair 2, conductor 3 comprises the tip conductor of pair 3, conductor 6 comprises the ring conductor of pair 3, conductor 7 comprises the tip conductor of pair 4, and conductor 8 comprises the ring conductor of pair 4.

As shown in FIG. 1, in the connection region where the contacts (blades) of a modular plug mate with the contacts of the modular jack, the conductors of the differential pairs are not equidistant from the conductors of the other differential pairs. By way of example, conductor 2 (i.e., the ring conductor of pair 2) is closer to conductor 3 (i.e., the tip conductor of pair 3) than is conductor 1 (i.e., the tip conductor of pair 2) to conductor 3. Consequently, differential capacitive and/or inductive coupling occurs between the conductors of pairs 2 and 3 that generate both NEXT and FEXT. Similar differential coupling occurs with respect to the other differential pairs in the modular plug and the modular jack.

U.S. Pat. No. 5,997,358 to Adriaenssens et al. (hereinafter "the '358 patent") describes multi-stage schemes for compensating NEXT for a plug-jack combination. The entire contents of the '358 patent are hereby incorporated herein by reference as if set forth fully herein. The connectors described in the '358 patent can reduce the "offending" NEXT that may be induced from the conductors of a first differential pair onto the conductors of a second differential pair in, for example, the contact region where the blades of a modular plug mate with the contacts of a modular jack. Pursuant to the teachings of the '358 patent, a "compensating" crosstalk may be deliberately added, usually in the jack, that reduces or substantially cancels the offending crosstalk at the frequencies of interest. The compensating crosstalk can be designed into the lead frame wires of the jack and/or into a printed wiring board that is electrically connected to the lead frame within the jack. As discussed in the '358 patent, two or more stages of NEXT compensation may be provided, where the magnitude and phase of the compensating crosstalk signal induced by each stage, when combined with the compensating crosstalk signals from the other stages, provide a composite compensating crosstalk signal that substantially cancels the offending crosstalk signal over a frequency range of interest. The multi-stage (i.e., two or more) compensation schemes disclosed in the '358 patent can be more efficient at reducing the NEXT than schemes in which the compensation is added at a single stage, especially when the second and subsequent stages of compensation include a time delay that is selected and/or controlled to account for differences in phase between the offending and compensating crosstalk signals. Efficiency of crosstalk compensation is increased if the first stage or a portion of the first stage design is contained in the lead frame wires.

Another type of crosstalk that must be considered is "alien" crosstalk and, in particular, alien NEXT. Alien NEXT is the differential crosstalk that occurs between communication channels. Obviously, physical separation between the jacks of the two channels at issue helps reduce alien crosstalk levels, as may some conventional crosstalk compensation techniques. However, a problem case may be "pair 3" of one channel crosstalking to "pair 3" of another channel, even if the pair 3 plug and jack wires in each channel are remote from each other and the only coupling occurs between the routed cabling. This form of alien NEXT occurs because of pair-to-pair unbalances that exist in the plug-jack combination, which results in mode conversions from differential NEXT to common mode NEXT and vice versa. In particular, differential-to-common mode crosstalk from pair 3 to both pair 2 and pair 4 can contribute to such mode conversion problems. To reduce this form of alien NEXT, shielded systems containing shielded twisted pairs or foiled twisted pair configurations may be used. However, the inclusion of shields can increase cost of the system. Another approach to reduce or minimize alien NEXT utilizes spatial separation of cables within a channel and/or spatial separation between the jacks in a channel. However, this is typically impractical because bundling of cables and patch cords is common practice due to "real estate" constraints and ease of wire management.

SUMMARY

Embodiments of the present invention can provide communications jacks that include a housing having a plug aperture that is configured to receive a mating plug that is inserted along a horizontal plug axis. The jacks further include a vertically-oriented wiring board that is mounted substantially normal to the horizontal plug axis. A first contact wire and a second contact wire that form a first differential pair of contact wires are provided, each of which have a fixed portion that is mounted in the vertically-oriented wiring board and a deflectable portion that is at least partially positioned in the plug aperture. A third contact wire and a fourth contact wire are provided that form a second differential pair of contact wires, each of which also have a fixed portion that is mounted in the vertically-oriented wiring board and a deflectable portion that is at least partially positioned in the plug aperture. In these jacks, at least a portion of the first differential pair of contact wires is positioned between the contact wires of the second differential pair of contact wires, and the deflectable portions of the third and fourth contact wires include a crossover. Additionally, the fixed portions of the third and fourth contacts are spaced further apart vertically than are the fixed portions of the first and second contacts.

In some embodiments, the jacks may also include a fifth contact wire and a sixth contact wire that form a third differential pair of contact wires, and a seventh contact wire and eighth contact wire that form a fourth differential pair of contact wires. In such embodiments, each of the fifth through eighth contact wires includes a fixed portion that is mounted in the vertically-oriented wiring board and a deflectable portion that is at least partially positioned in the plug aperture. In these embodiments, the third contact wire and the fourth contact wire may each include a second fixed portion that is mounted in the vertically-oriented wiring board. The third contact wire and the fourth contact wire may each include a first longitudinal segment that includes the fixed portion, a second longitudinal segment that includes the second fixed portion, a third longitudinal segment that includes a plug contact region that is configured to make electrical contact with a contact of a mating plug, and a transverse segment that connects the first, second and third longitudinal segments. The transverse segment of the third contact wire may cross the first and second contact wires and at least one of the fifth through eighth contact wires, and the transverse segment of the fourth contact wire may cross the first and second contact wires and at least one of the fifth through eighth contact wires. As a non-limiting example, in certain of these embodiments, the first and second contact wires may be contact wires 4 and 5, respectively, of a TIA/EIA 568 type B jack, the third and fourth contact wires may be contact wires 3 and 6, respectively, of a TIA/EIA 568 type B jack, the fifth and sixth contact wires may be contact wires 1 and 2, respectively, of a TIA/EIA 568 type B jack, and the seventh and eighth contact wires may be contact wires 7 and 8, respectively, of a TIA/EIA 568 type B jack.

In some embodiments, the fixed portions of the second, third, fifth and seventh contact wires and the second fixed portion of the third contact wire may be at least generally aligned in a first row, and the fixed portions of the first, fourth, sixth and eighth contact wires and the second fixed portion of the fourth contact wire may be generally aligned in a second row that is below the first row. The second fixed portion of the third contact wire may be on one end of the first row and the second fixed portion of the fourth contact wire may be on one end of the second row. Additionally, the fixed portion and the second fixed portion of the third contact wire may be mounted above the fixed portions of the second and fifth contact wires, and the fixed portion and the second fixed portion of the fourth contact wire may be mounted below the fixed portions of the first, and eighth contact wires. The third differential pair of contact wires and the fourth differential pair of contact wires may also each include a crossover.

In some embodiments, the jack may further include a second wiring board that includes a plurality of contact pads. In such embodiments, the deflectable portion of at least some of the first through eighth contact wires may be configured to make physical and electrical contact with respective contact pads when the mating plug is received within the plug aperture.

Pursuant to further embodiments of the present invention, communications jacks are provided that include a housing that has a plug aperture that is configured to receive a mating plug that is inserted along a first axis. The jacks also include a wiring board that is mounted substantially perpendicular to the first axis. The jacks further include first through eighth contact wires, each of which has a termination end that is mounted in the wiring board and a free end that includes a plug contact region. Moreover, the third and sixth contact wires also each include a second termination end that is mounted in the wiring board and a crossover segment that connects the first and second termination ends. In these jacks, the fourth and fifth contact wires form a first differential pair of contact wires, the first and second contact wires form a second differential pair of contact wires, the third and sixth contact wires form a third differential pair of contact wires, and the seventh and eighth contact wires form a fourth differential pair of contact wires. Thus, in certain of these embodiments, the first through eighth contact wires may correspond to the first through eighth contact wires, respectively, of a TIA/EIA 568 type B jack. The plug contact regions of the first through eighth contact wires are arranged in a generally side-by-side relationship in numerical order, and the third contact wire crosses at least the fourth, fifth and sixth contact wires, while the sixth contact wire crosses at least the third, fourth and fifth contact wires.

In some embodiments, the crossover segment of the third contact wire may be substantially perpendicular to the first termination end of the third contact wire and to the second termination end of the third contact wire. The termination ends of the first, fifth and seventh contact wires and the first and second termination ends of the third contact wire may be generally aligned in a first row, and the termination ends of the second, fourth and eighth contact wires and the first and second termination ends of the sixth contact wire may be generally aligned in a second row that is vertically spaced apart from the first row.

In some embodiments, the surface of the wiring board into which the first through fourth contact wires are mounted may define an x-y plane, and the first termination end of the third contact wire and the first termination end of the sixth contact wire may be spaced apart a first distance in the x-direction and a second distance in the y-direction, and the termination end of the fourth contact wire and the termination end of the fifth contact wire may be spaced apart by a third distance in the x-direction and a fourth distance in the y-direction. The first distance may exceed the third distance and the second distance may exceed the fourth distance. Additionally, the second differential pair of contact wires may include a crossover and the fourth differential pair of contact wires may include a crossover.

Pursuant to still further embodiments of the present invention, contact wires that are suitable for use in an RJ-45 communications jack are provided. These contact wires include first and second termination ends, each of which have a press-fit termination, a crossover section that connects the first termination end and the second termination end, and a longitudinal segment that includes a free end and a plug contact region that is configured to make physical and electrical contact with a contact of a mating plug connector, the longitudinal segment extending from the crossover section. In some embodiments, the first termination end, the second termination end and the longitudinal segment may be generally parallel to each other. Additionally, the crossover section may be generally perpendicular to the longitudinal segment.

DETAILED DESCRIPTION

Figure 1:
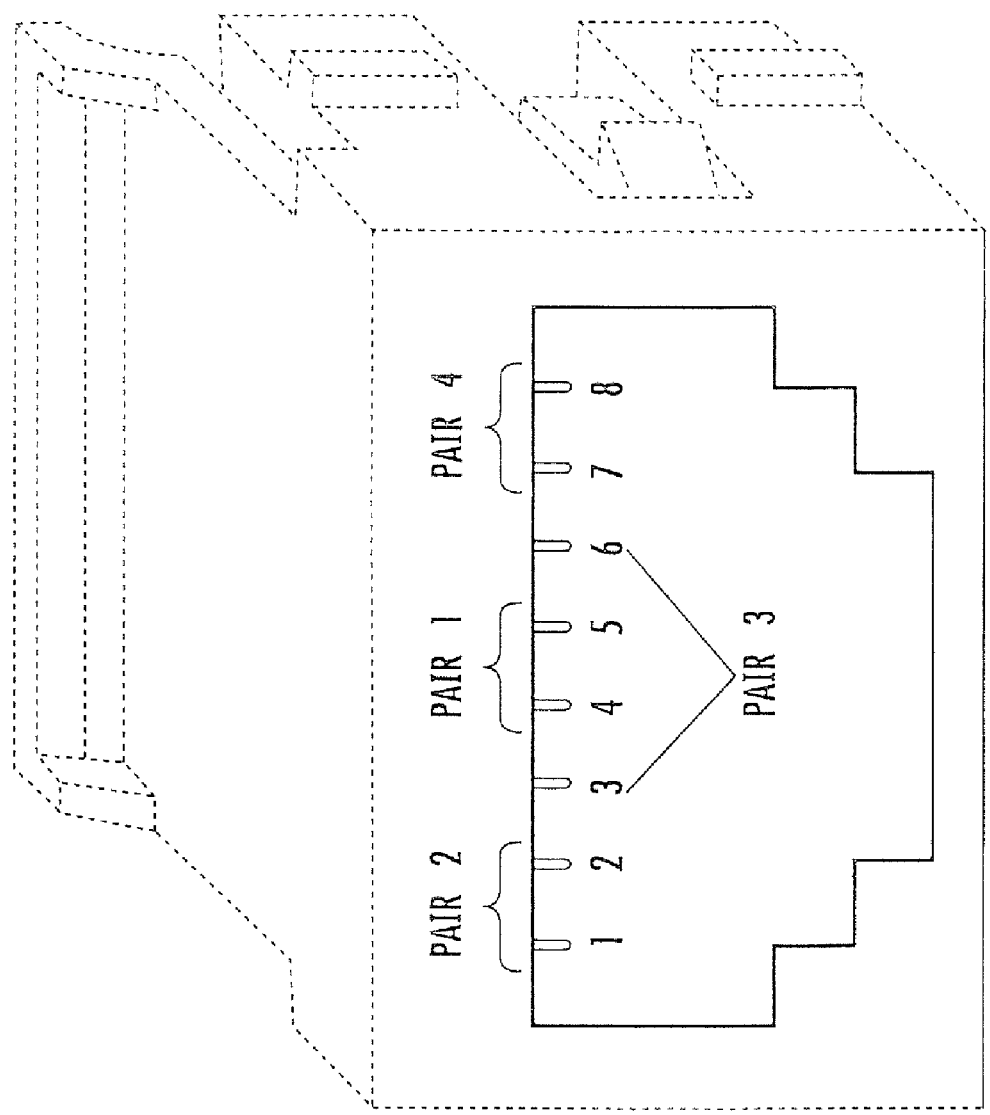
FIG. 1 shows the modular jack contact wiring assignments for an 8-position communications jack (T568B) as viewed from the front opening of the jack.

The present invention is described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. As used herein, the term "and/or" includes any and all combinations of one or more of the associated listed items.

As used herein, the terms "attached" or "connected" can mean either a direct or an indirect attachment or connection between elements. In contrast, the terms "directly attached" and "directly connected" refer to a direct attachment and direct connection, respectively, without any intervening elements.

This invention is directed to communications connectors, with a primary example of such being a communications jack that includes a plug aperture that receives a mating plug that is inserted along a plug axis. The communications jacks according to embodiments of the present invention may include contact wires that include a crossover in the pair 3 contact wires (as the contact wires are defined in TIA/EIA 568B). These contact wires are mounted on a wiring board that is mounted normal to the plug axis. The contact wires of pairs 1 and 3 may also include a heightened stagger. This heightened stagger may be used to reverse the polarity of the crosstalk between the contact wires of pairs 1 and 3 just outside the plug contact regions of the contact wires and before the crossover in the pair 3 contact wires. As discussed herein, the communications jacks according to embodiments of the present invention can efficiently compensate differential-to-differential crosstalk between pairs 1 and 3; pairs 2 and 3; and pairs 3 and 4, while also providing enhanced differential-to-common mode crosstalk compensation on pair 3 to pair 2 and for pair 3 to pair 4. As discussed above, the differential-to-common mode crosstalk from pair 3 to pairs 2 and 4 can be the most problematic in terms of mode conversion. Thus, the communications jacks according to certain embodiments of the present invention can provide high levels of differential-to-differential crosstalk compensation while also reducing mode conversion and providing enhanced channel performance.

Figure 2:
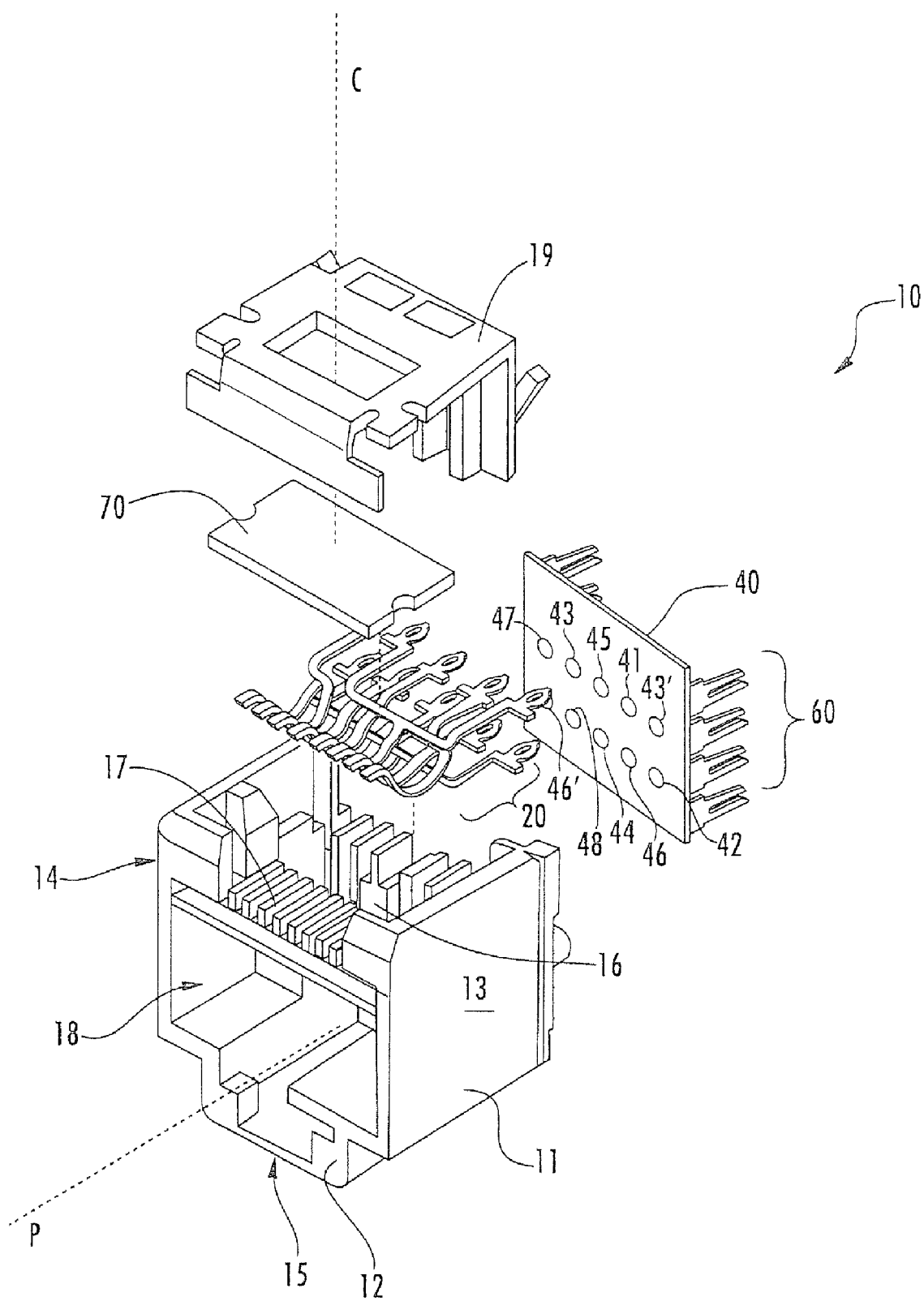
FIG. 2 is an exploded perspective view of a communications jack according to embodiments of the present invention.

FIGS. 2-8 illustrate a communications jack, designated broadly as 10, according to certain embodiments of the present invention. FIG. 2 is an exploded perspective view of the communications jack 10. As shown in FIG. 2, the jack 10 includes a jack frame 11 that includes a plug aperture 18 for receiving a mating plug, a cover 19, a plurality of contact wires which are broadly designated as 20 (designated individually as 20-1 through 20-8 in FIGS. 3-5), a first, vertically-oriented wiring board 40, a second, horizontally-oriented wiring board 70, a plurality of insulation displacement contacts that are broadly designated as 60, and an IDC cover (not shown in the figures).

The jack frame 11 has a front face 12 that includes the plug aperture 18. The jack flame 11 further includes side walls 13, 14, a bottom wall 15, a back wall 16 and a comb structure 17 that define the sides, bottom, rear and top, respectively, of the plug aperture 18. Note that some or all of the walls 13-16 may be partial walls. The plug aperture 18 comprises a cavity that is sized and configured to receive a mating communications plug that is inserted into the plug aperture 18 along the plug axis "P" shown in FIG. 2. The plug axis P is normal to the front face 12 of the jack frame 11. Most typically, communications jacks such as the jack depicted in FIG. 2 are mounted so that the opening to the plug aperture that receives the mating plug defines a vertical plane. Consequently, the plug axis "P" will most typically be a horizontal axis. However, it will be appreciated that the communications jack may be mounted in different orientations such as, for example, rotated ninety degrees so that the opening to the plug aperture defines a horizontal plane. When the communications jack 10 is mounted in this manner, the horizontally-oriented elements in FIG. 2 will become vertically-oriented elements and vice versa. Thus, it will be appreciated that herein terms such as "horizontally-oriented" and "vertically-oriented" and the like are used to describe the relative orientation of components of the communications jack with respect to each other, and do not limit the present invention to communications jacks that are mounted in a particular orientation.

The cover 19 may generally have an "L" shape. The cover 19 extends across the top of the jack frame 11, and part of the cover 19 may complete the back wall 16 of the jack frame 11. The jack frame 11, the cover 19 and the IDC cover (not shown in the figures) together comprise a housing that defines the plug aperture and protects other of the components of the communications jack 10. The jack frame 11, the cover 19 and the IDC cover may be made of a suitable insulative plastic material that meets all applicable standards with respect to, for example, electrical breakdown resistance and flammability. Typical materials include, but are not limited to, polycarbonate, ABS, and blends thereof. The jack frame 11, the cover 19 and the IDC cover may be conventionally formed and hence will not be described in further detail herein. Those skilled in this art will recognize that a wide variety of other configurations of housings may also be employed in embodiments of the present invention, and that the housing may comprise more or less pieces than the exemplary housing illustrated in FIG. 2.

The contact wires 20 each comprise a conductive element that is used to make physical and electrical contact with a respective contact on a mating communications plug. Typically, the contact wires 20 comprise spring contact wires that are formed of resilient metals such as spring-tempered phosphor bronze, beryllium copper, or the like. A typical cross section of each contact wire 20 is 0.017 inches wide by 0.010 inches thick. As shown in FIG. 2, the contact wires 20 are mounted on the first, vertically-oriented wiring board 40 in cantilever fashion so that the contact wires 20 are cantilevered from the rear of the jack 10 toward the front of the jack 10 and extend into the plug aperture 18.

Figure 3:
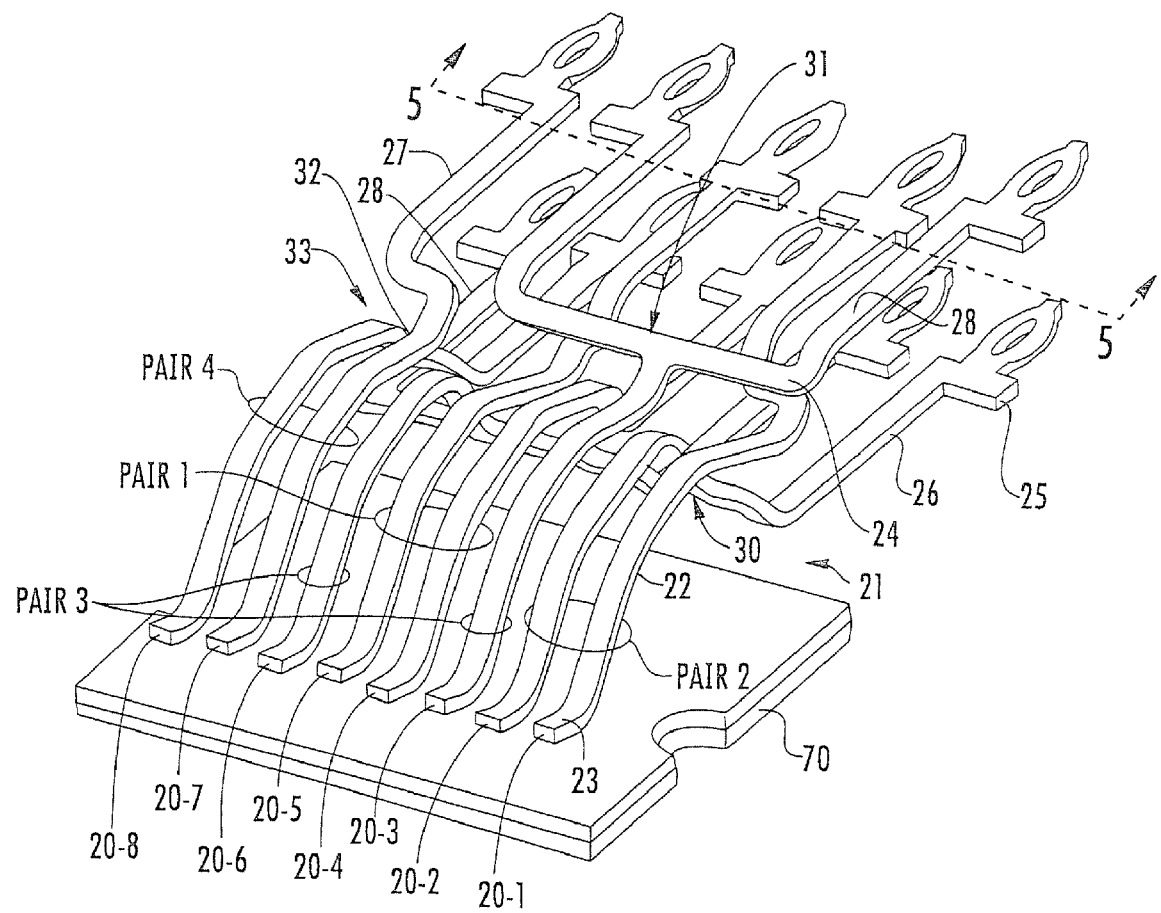
FIG. 3 is an enlarged perspective view of the contact wires of the communications jack of FIG. 2.
Figure 4:
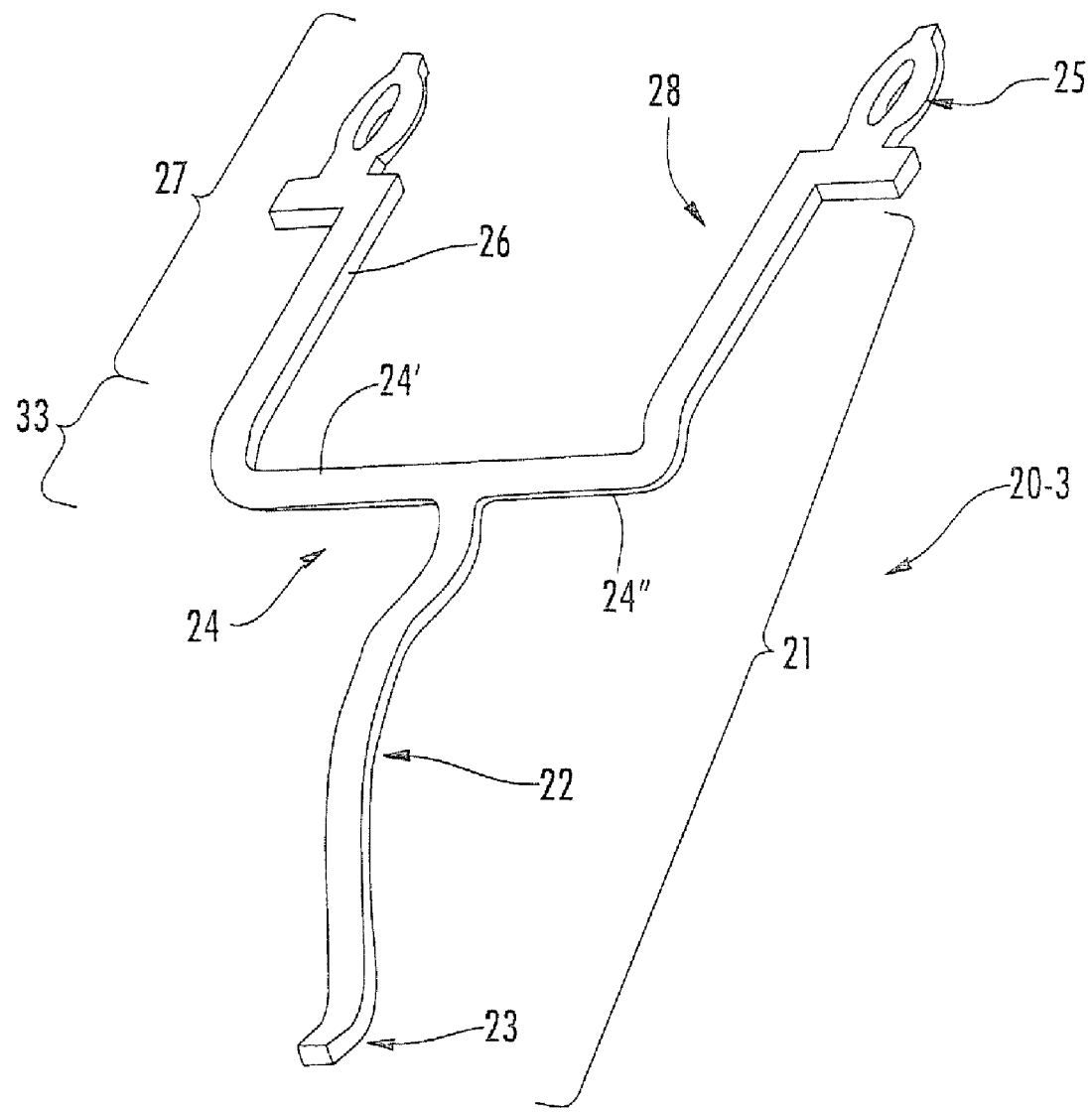
FIG. 4 is an enlarged perspective view of one of the contact wires of the communications jack of FIG. 2.
Figure 5:
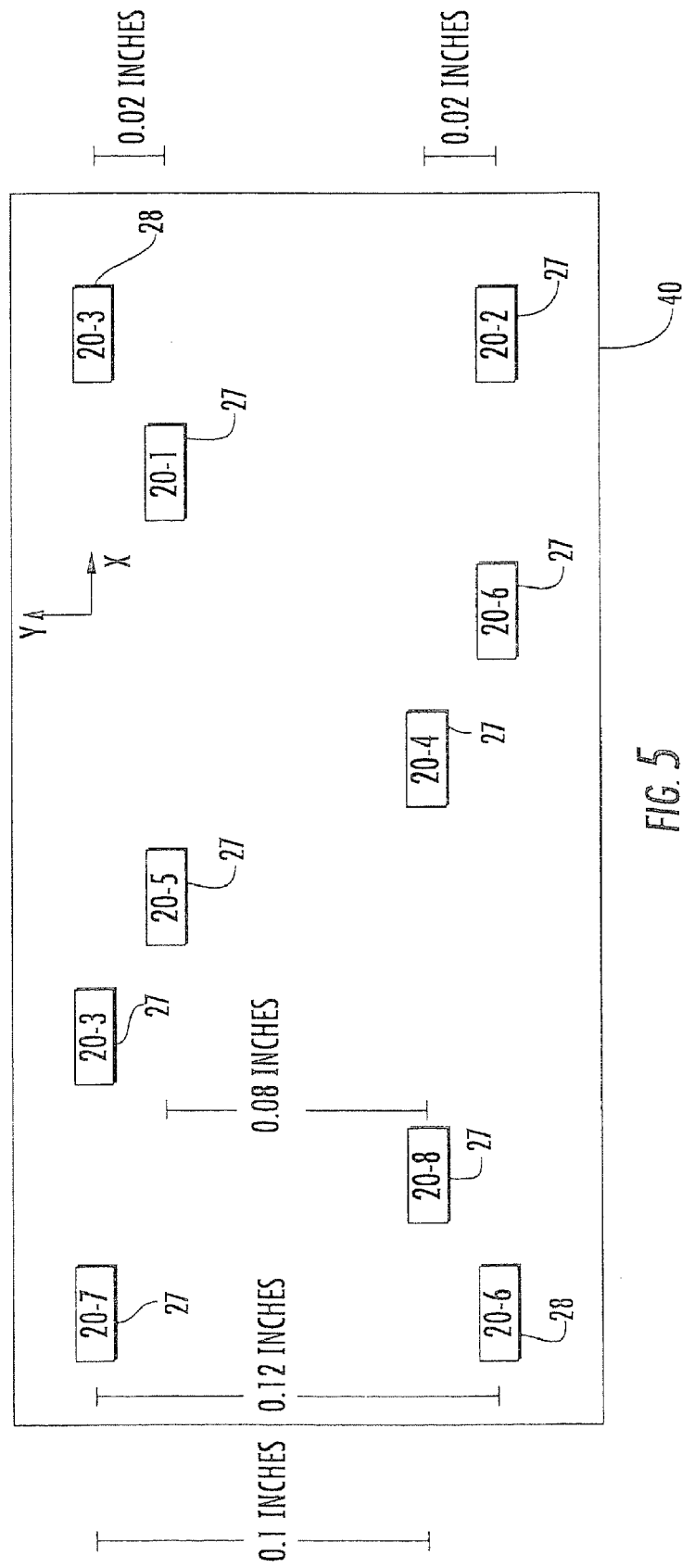
FIG. 5 is a cross-sectional view of the contact wires of FIG. 3 taken along the line 5-5 of FIG. 3.

FIG. 3 is an enlarged perspective view of the contact wires 20-1 through 20-8 that more clearly illustrates the paths traversed by each contact wire. FIG. 4 is an enlarged perspective view of contact wire 20-3. FIG. 5 is a cross-sectional view of the contact wires 20 taken along the line 5-5 of FIG. 3. The contact wires 20 of jack 10 will now be discussed in greater detail with respect to FIGS. 3-5. Note that in FIGS. 3-5 the contact wires 20 have been rotated 180 degrees from their orientation in FIG. 2.

Turning first to FIG. 3, it can be seen that the contact wires 20 (which are individually labeled in FIGS. 3-5 as contact wires 20-1 through 20-8) are arranged in differential pairs as defined by TIA 568B. In particular, contact wires 20-4, 20-5 form a first differential pair (pair 1) of contact wires that may be used to carry a first differential signal, contact wires 20-1, 20-2 form a second differential pair (pair 2) of contact wires that may be used to carry a second differential signal, contact wires 20-3, 20-6 form a third differential pair (pair 3) of contact wires that may be used to carry a third differential signal, and contact wires 20-7, 20-8 form a fourth differential pair (pair 4) of contact wires that may be used to carry a fourth differential signal. Thus, communication jack 10 may carry up to four differential signals at a time. As shown in FIG. 3, contact wires 20-4, 20-5 are in the center positions in the contact wire array, contact wires 20-1, 20-2 are adjacent to each other and occupy the rightmost two positions (from the vantage point of FIG. 3) in the sequence, and contact wires 20-7, 20-8 are adjacent to each other and occupy the leftmost two positions (from the vantage point of FIG. 3) in the sequence. Contact wires 20-3, 20-6 are positioned so that, in the plug contact regions of the contact wires, these contact wires sandwich contact wires 20-4 and 20-5 (i.e., contact wires 20-4 and 20-5 are both positioned between contact wires 20-3 and 20-6 in the plug contact region of the contact wires).

Referring now to FIGS. 2-4 (and, in particular, to FIG. 4 in which the regions of each contact wire are illustrated on an enlarged depiction of contact wire 20-3), each of the contact wires 20 has a deflectable portion 21 that extends into the plug aperture 18 and a fixed portion 25 that is mounted in the vertically-oriented wiring board 40. The deflectable portion 21 of each contact wire 20 refers to the portion of the contact wire 20 that moves when a mating plug is received within the plug aperture 18 so as to come into physical contact with the contact wires 20. The deflectable portion 21 of each contact wire 20 includes a plug contact region 22 and a free end portion 23. The deflectable portion 21 of some of the contact wires 20 further includes a crossover section 24 where the contact wire crosses over and/or under one or more of the other contact wires when the contact wires 20 are viewed from above (i.e., when viewed along the vertical axis "C" in FIG. 2). The crossover sections 24 are located in a crossover region 33 of the array of contact wires 20. Finally, each contact wire 20 includes a termination end 27 that comprises the portion of the contact that extends from the crossover region 33 to the fixed portion 25 of the contact wire that is mounted in the vertically-oriented wiring board 40. In the particular embodiment of the present invention depicted in FIGS. 2-8, the termination end 27 of each contact wire 20 includes the fixed portion 25 of the contact wire and part of the deflectable portion 21 of the contact wire (i.e., the part from the fixed portion 25 up to the crossover region 33). As known to those of skill in the art, the set of contact wires 20 are often referred to as a "lead frame."

Figure 6:
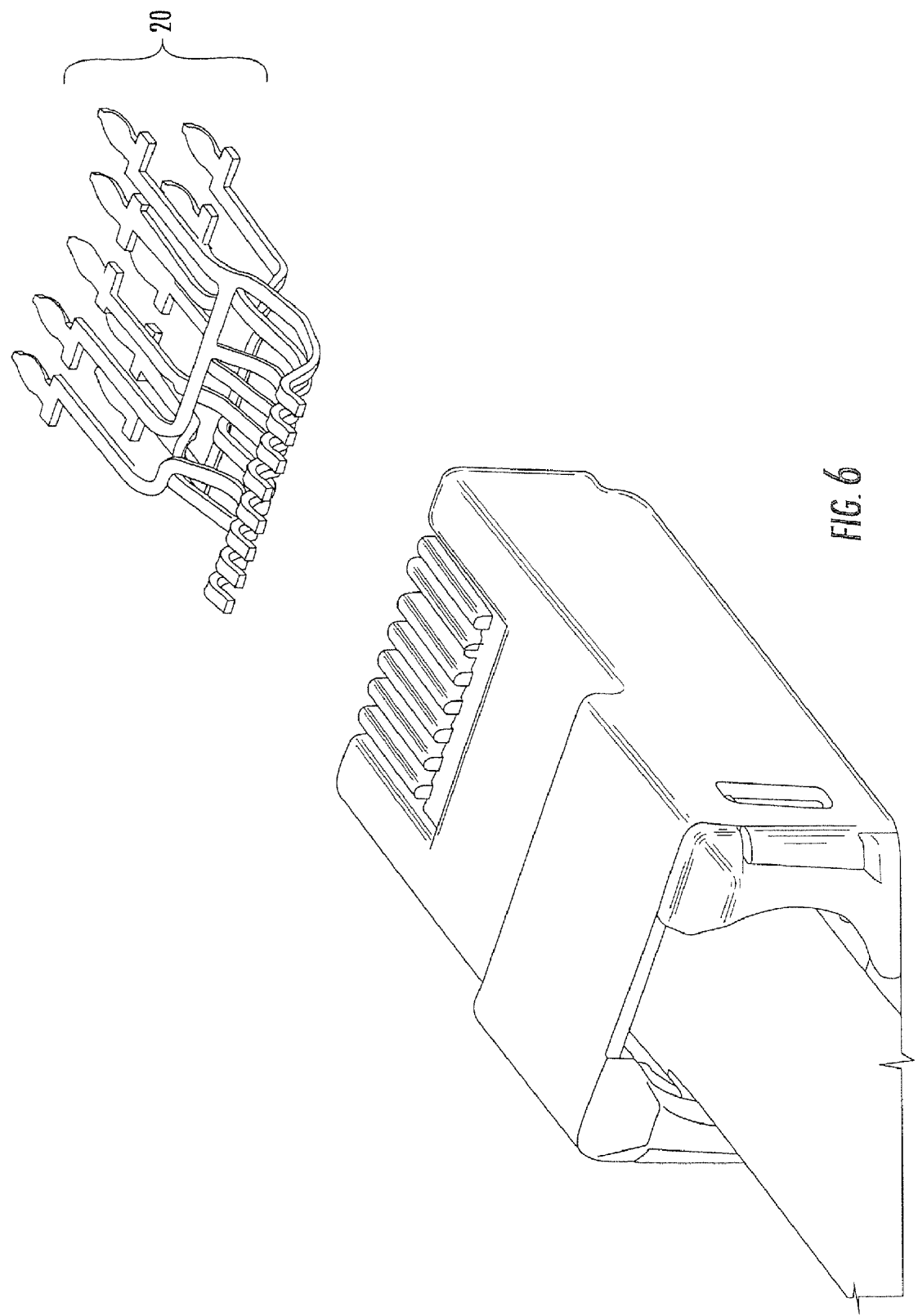
FIG. 6 is a perspective view of the contact wires of FIG. 3 that shows how the contact wires mate with a mating plug.

As noted above, the deflectable portion 21 of each contact wire 20 further includes a plug contact region 22 and a free end 23. The plug contact region 22 comprises the portion of the contact wire that is configured to make physical contact with a respective one of the contacts (e.g., plug blades) on a mating plug when the mating plug (see FIG. 6) is received within the plug aperture 18 of communications jack 10 along the direction of the horizontal plug axis P (see FIG. 2). Typically, the plug contact regions 22 of all eight contact wires will be aligned in a generally parallel, side-by-side relationship as shown in FIGS. 2-3 and 6. The free end 23 refers to the end portion of the contact wire that extends beyond the plug contact region 22. The free ends 23 of the contact wires 20 extend into individual slots in the comb structure 17. The free ends 23 of the contact wires 20 may, in some embodiments, be aligned parallel and generally co-planar with one another, as shown in FIGS. 2-3 and 6. The free ends 23 may be spaced apart from one another by, for example, 0.04 inches.

When a mating plug is received within the plug aperture 18 and communications signals are transmitted through the contact wires 20, current will flow from the fixed portion 25 of each contact wire 20 to the plug contact region 22 of the contact wire, or current will flow from the mating plug contact, through the plug contact region 22 to the fixed portion 25 of the contact wire 20 (depending upon the direction of travel of the communications signal). However, current will generally not flow forward of the plug contact regions 22 (i.e., into the free end 23 of each contact wire 20), as the free end 23 of the contact wire comprises a "dead-end" branch off of its respective signal carrying path through the jack 10. Consequently, only capacitive coupling (and accompanying crosstalk) is generated between the free ends 23 of the contact wires 20, whereas rearward of the plug contact regions 22, both inductive and capacitive coupling/crosstalk will occur.

The termination end 27 of each of the contact wires 20 includes a deflectable segment 26 (it will be appreciated that while the deflectable segments 26 of the contact wires depicted in FIGS. 2-4 and 6 are generally straight, they need not be straight in other embodiments) and the fixed portion 25. In the particular embodiment of FIGS. 2-8, the fixed portion 25 comprises an "eye-of-the-needle" or other press-fit termination that may be inserted into a metal-plated aperture on the vertically-oriented wiring board 40 without the need for a soldered connection. The rear wall 16 of the jack frame 11 includes a plurality of vertical slots. The cover 19 includes mating projections (not visible in FIG. 2) that fill the vertical slots in the rear wall 16. A portion of the termination end 27 of each contact wire 20 passes through one of the vertical slots in the rear wall 16, and when the cover 19 is placed on the jack frame 11 the projections thereon capture this portion of the termination end 27 (i.e., the portion just before the press-fit termination) of each contact wire 20 and lock it into place. The press-fit termination of each contact wire 20 passes through an opening between the vertical slot in the rear wall 16 and the corresponding projection on the cover 19 so as to extend outside the rear of jack frame 11 for mating with the vertically-oriented wiring board 40.

As can best be seen in FIG. 3, the contact wires 20-1, 20-2 of pair 2, the contact wires 20-3, 20-6 of pair 3, and the contact wires 20-7, 20-8 of pair 4 include a respective "crossover." These crossovers are labeled 30, 31, 32 in FIG. 3. Herein, the term "crossover" is used to refer to a location in which the contact wires of a differential pair of contact wires cross each other without making electrical contact when the contact wires are viewed from the perspective of axis "C" in FIG. 2 (i.e., when the jack is viewed from either above or below) when the jack is oriented as shown in FIG. 2. Crossovers are included to provide compensatory crosstalk between contact wires. Typically, such crossovers are provided so that the contact wires of a differential pair of contact wires trade positions. Thus, in some embodiments, when a differential pair of contact wires includes a crossover, the free end 23 of each contact wire 20 of the pair may be generally aligned longitudinally with the termination end 27 of the other contact wire 20 of the pair. The crossovers 30, 31, 32 may be located, for example, approximately in the center of their contact wires (between the free ends 23 of the contact wires 20 and their fixed portions 25). Each of the crossovers 30, 31, 32 are located in the deflectable portions 21 of the contact wires 20. In some embodiments, the crossovers may be located as close to the plug contact regions 22 of the contact wires 20 as possible, in order to limit the degree of offending crosstalk and to generate compensating crosstalk as close as possible to the plug contact region 22 where the offending crosstalk is generated. In the illustrated embodiment, the crossovers 30, 32 are implemented via complementary localized bends in the crossing contact wires, with one wire being bent upwardly and the other wire being bent downwardly. The manner in which the crossover 31 on pair 3 is implemented is discussed in more detail below. The presence of a crossover, structural implementations thereof, and its effect on crosstalk are discussed in some detail in the '358 patent described above and U.S. Pat. No. 5,186,647 to Denkmann et al. The contact wires of pair 1 (wires 20-4, 20-5) do not include a crossover in the particular embodiment of FIGS. 2-8.

As shown best in FIGS. 3-5, contact wires 20-3 and 20-6 have a non-traditional shape. In particular, each of these contact wires includes the standard termination end 27 along with a second termination end 28. Contact wires 20-3 and 20-6 further each include a crossover section 24 which, in this particular embodiment, is implemented as a transverse segment that connects the standard termination end 27 and the second termination end 28. Each contact wire 20-3, 20-6 further includes a fourth distinct segment that includes the plug contact region 22 and the free end 23 of the contact wire.

As can be seen in FIGS. 3-4, a first portion 24' of the crossover section 24 on each of contacts 20-3 and 20-6 is used to implement the crossover on pair 3, as the portion 24' effectively allows the contact wires 20-3 and 20-6 to change positions approximately halfway through the lead frame. A second portion 24" of the crossover section 24 on each of contacts 20-3 and 20-6 is used to connect to the second termination end 28 of the contact wire. This second termination end 28 may serve multiple functions. First, the second termination 28 end may provide physical support to the contact wire that it is part of in order to enhance the mechanical integrity and stability of the contact wire. This may facilitate ensuring that the first portion 24' of the crossover section 24 does not come into physical contact with any of the other contact wires (and in particular, contact wires 20-4 and 20-5) when a mating plug is inserted into the plug aperture 18. Additionally, as will be discussed in greater detail below, the second termination end 28 may connect to one or more crosstalk compensation circuits on the vertically-oriented wiring board 40. Moreover, as discussed in greater detail below, the second termination end 28 of each contact wire 20-3, 20-6 may also capacitively couple with the termination end 27 of at least one adjacent contact wire (e.g., as shown best in FIG. 5, the second termination end 28 of contact 20-3 couples with the termination end 27 of contact wire 20-1 and the second termination end 28 of contact 20-6 couples with the termination end 27 of contact wire 20-8), which can provide additional crosstalk compensation. It will be appreciated, however, that the second termination end 28 need not perform all of these functions. The contact wire configuration of FIG. 3 enables the commencement of inductive differential-to-differential and differential-to-common mode crosstalk compensation at minimal delay from the corresponding crosstalk sources (i.e., the plug contact region 22 of the contact wires 20 and the mating plug), which can be important to effective crosstalk compensation.

As can best be seen in FIG. 3, the transverse crossover section 24 provided on each of contacts wires 20-3, 20-6 "crosses" a plurality of the other contact wires 20. In particular, the transverse crossover section 24 of contact wire 20-3 crosses contact wires 20-1, 20-4, 20-5 and 20-6, and the transverse crossover section 24 of contact wire 20-6 crosses contact wires 20-3, 20-4, 20-5 and 20-8. Herein, the terms "cross" and "crosses" are used to refer to a first contact wire passing from one side to the other side of a second contact wire (i.e., either over or under) without making electrical contact when the first and second contact wires are viewed from the perspective of axis "C" in FIG. 2 (i.e., when the jack is viewed from either above or below). Thus, when the two contact wires of a differential pair cross, a crossover is formed.

Note that in FIG. 3, the various elements/portions of each contact wire (e.g., fixed portion 25) have only been designated on an exemplary one of the eight contact wires. It will be appreciated that each of the eight contact wires include each identified element/portion, except that only six of the contact wires (20-1, 20-2, 20-3, 20-6, 20-7, 20-8) include the crossover 24, and only two of the contact wires (20-3, 2-6) include the second termination ends 28. Each portion/element of each contact wire is not individually labeled in FIG. 3 in order to simplify FIG. 3.

FIG. 5 is a cross-sectional view of the contact wires of FIG. 3 taken along the line 5-5 of FIG. 3, which shows the relative positions of the contact wires 20 as they enter the vertically-oriented wiring board 40. The individual contact wires 20 separate from each other vertically to varying degrees as the contact wires approach the wiring board 40. As is apparent from FIGS. 3 and 5, the contact wires 20 include an exaggerated vertical stagger. As can be seen, for example, in FIGS. 2 and 5, the front face of the vertically-oriented wiring board 40 (i.e., the surface into which the contact wires 20 are mounted) defines a vertically oriented plane. In FIG. 5, an x-y axis has been superimposed on the wiring board 40, where the x-axis is a horizontal axis and the v-axis is a vertical axis. The term "vertical stagger" is used herein to refer to the distance between portions of the contact wires 20 of a pair in the y-direction of FIG. 5.

As shown in FIG. 3, the vertical stagger in the contact wires 20 starts between the plug contact regions 22 of the contact wires 20 and the crossover section 24 of the contact wires 20. As shown in FIG. 5, the contact wires of pair 3 (20-3 and 20-6) have the largest vertical stagger (i.e., are separated by the largest distance in the y-direction), while the contact wires of pair 1 (20-4 and 20-5) have the smallest vertical stagger, which facilitates implementing the pair 3 crossover without short-circuiting any of the contact wires 20-3 through 20-6.

As can best be seen in FIG. 5, as a result of the vertical stagger, the termination ends 27, 28 of the contact wires 20 are generally aligned in two rows on the vertically-oriented wiring board 40. The top row includes the termination ends 27 of contact wires 20-1, 20-3, 20-5 and 20-7 and the second termination end 28 of contact wire 20-3. The bottom row includes the termination ends 27 of contact wires 20-2, 20-4, 20-6 and 20-8 and the second termination end 28 of contact wire 20-6. The contact wires are not perfectly aligned in two rows; instead, the termination ends 27 of contact wires 20-1 and 20-5 are located approximately 0.020 inches below the termination ends 27, 28 of the other contact wires in the top row, and the termination ends 27 of contact wires 20-4 and 20-8 are located approximately 0.020 inches above the termination ends 27, 28 of the other contact wires in the bottom row. The termination end 27 of each contact wire is spaced apart horizontally from its adjacent contact wire(s) by 0.040 inches. In some embodiments of the present invention, the vertical stagger on pairs 1 and 3 may be sufficiently pronounced so as to flip the polarity of the coupling between pairs 1 and 3 between the plug contact regions 22 and the crossover section 24 of the contact wires on pairs 1 and 3 (i.e., in the plug contact region 22, the largest coupling is between contact wires 20-3 and 20-4 and between 20-5 and 20-6, whereas the vertical stagger is sufficiently large such that even before the crossover in pair 3, the coupling flips polarity and is between contact wires 20-4 and 20-6 and between contact wires 20-3 and 20-5). This vertical stagger may be used to start compensating for the offending crosstalk introduced in the plug and in the plug contact region 22 of the contact wires 20 even before the crossover in pair 3.

The vertically-oriented wiring board 40 may be formed of conventional materials and may comprise, for example, a printed circuit board. The wiring board 40 may be a single layer board or may have multiple layers. The wiring board 40 may be substantially planar as illustrated, or may be non-planar. As discussed above, each of the contact wires 20 is mounted to the vertically-oriented wiring board 40. This may be accomplished, for example, by inserting the press-fit terminations into a respective metal-plated aperture 41-48 in the wiring board 40 for current carrying members of the lead frame, as shown in FIG. 2. Metal-plated apertures 43' and 46' are also provided which receive the non-current carrying members of the second termination ends of contact wires 20-3 and 20-6. A plurality of conductive traces 49 (see FIG. 7) are provided on the wiring board 40. The conductive traces 49 may be formed of conventional conductive materials and may be deposited on the wiring board 40 via any deposition method known to those skilled in this art to be suitable for the application of conductors. A current carrying one of the conductive traces 49 connects to a respective one of the metal-plated apertures 41-48 to provide conductive paths from each of the metal plated apertures 41-48 to a respective output terminal 60 (see FIGS. 2 and 7) of the communication jack 10. Conductive traces 49 are also connected to metal-plated apertures 43' and 46' to provide a conductive path to compensation elements within wiring board 40.

Figure 7:
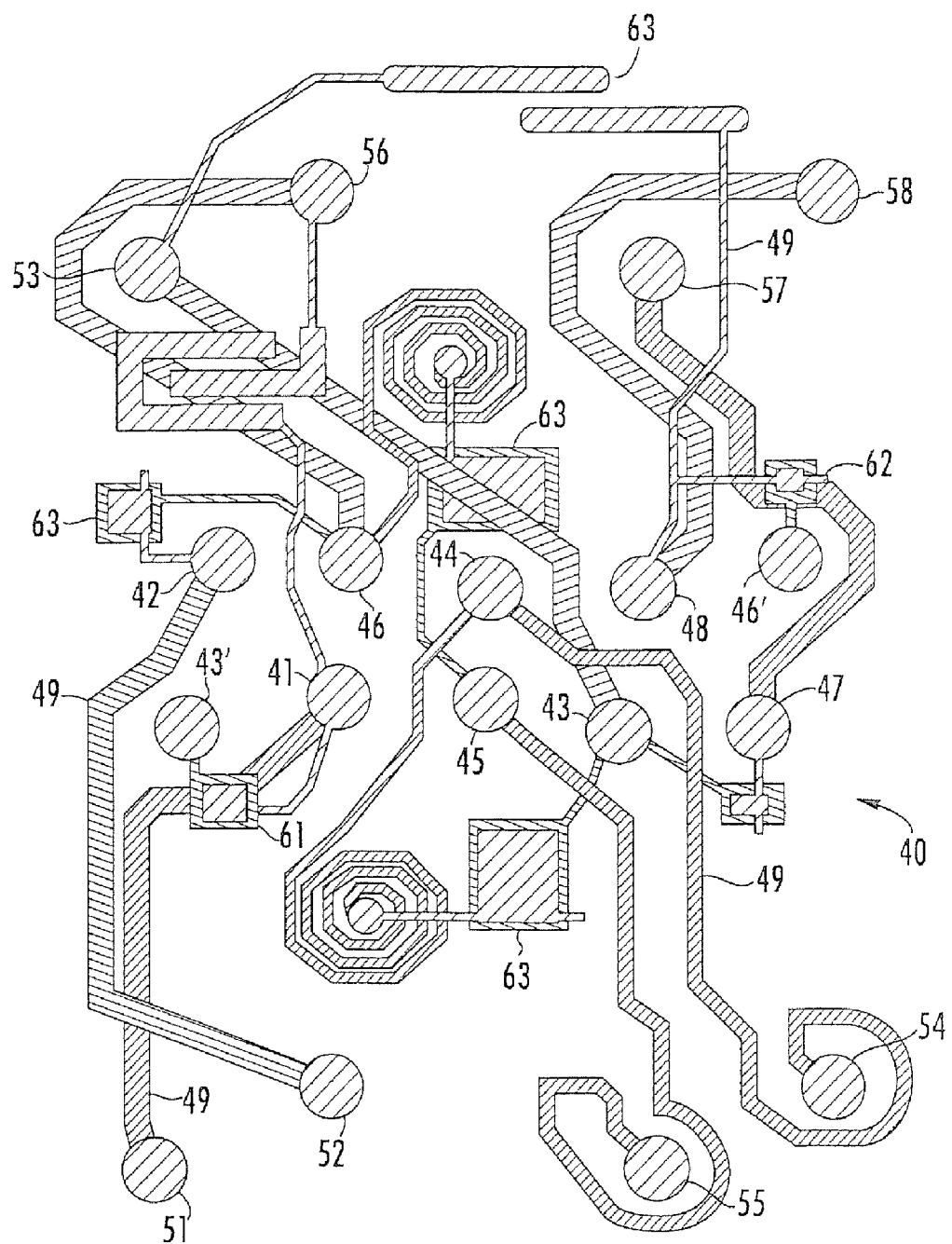
FIG. 7 is a plan view of the vertically-oriented wiring board of the communications jack of FIG. 2.

FIG. 7 is a plan view of one implementation of the vertically-oriented wiring board 40 according to certain embodiments of the present invention. The wiring board 40 is a multi-layer wiring board, and hence in FIG. 7, the conductive traces 49 are given different cross-hatching schemes which indicate the particular layer of the wiring board 40 on which each conductive trace 49 resides. Electrical connections are made between conductive traces on different layers of the wiring board 40 using one or more metal-plated vias 59 (or other layer-transferring structures known to those skilled in this art). As shown in FIG. 7, each of the metal plated apertures 41-48 that receive the fixed portion 25 (in the form of an eye-of-the needle termination) of a respective one of the contact wires 20 is electrically connected to a respective one of the IDC apertures 51-58 via a respective conductive path. Each conductive path is formed by one or more of the conductive traces 49 and conductive vias 59. In this manner, each of the contact wires 20-1 through 20-8 is electrically connected to a corresponding one of the output terminals 60. As is also shown in FIG. 7, various crosstalk compensation structures 50 may be included on the wiring board 40. In particular, a first capacitor 61 is provided on the wiring board 40 that is connected, via apertures 41 and 43' and conductive traces, to the second termination end 28 of contact wire 20-3 and to contact wire 20-1 to provide additional crosstalk compensation between pairs 2 and 3. A second capacitor 62 is provided on the wiring board 40 that is connected, via apertures 48 and 46' and conductive traces, to the second termination end 28 of contact wire 20-6 and to contact wire 20-8 to provide additional crosstalk compensation between pairs 3 and 4. Placing capacitors on the ring side can also be done for general differential-to-differential crosstalk compensation between pairs 2 and 3 and/or between pairs 3 and 4. In further embodiments of the present invention, the second termination end 28 of the contact wire 20-3 and the termination end of contact wire 20-5 may be connected, via apertures 43' and 45 and conductive traces, to an additional capacitor, and/or the second termination end 28 of the contact wire 20-6 and the termination end of contact wire 20-4 may be connected, via apertures 44 and 46' and conductive traces, to an additional capacitor, in order to provide additional differential-to-differential crosstalk compensation between pairs 1 and 3. Such additional differential-to-differential crosstalk compensation may be provided, for example, on vertically-oriented wiring board 40 in embodiments that do not include the horizontally-oriented wiring board 70.

Referring once again to FIG. 2, eight output terminals 60 project rearwardly from the wiring board 40 to connect electrically with respective conductors (e.g., the conductors of a twisted pair cable). In this particular embodiments, the output terminals 60 are in the form of eight insulation displacement contacts ("IDCs") 60. An IDC 60 is inserted into a respective one of eight metal plated IDC apertures 51-58 that are provided on the vertically-oriented wiring board 40. The IDCs are of conventional construction and need not be described in detail herein; exemplary IDCs are illustrated and described in U.S. Pat. No. 5,975,919 to Arnett.

Figure 8:
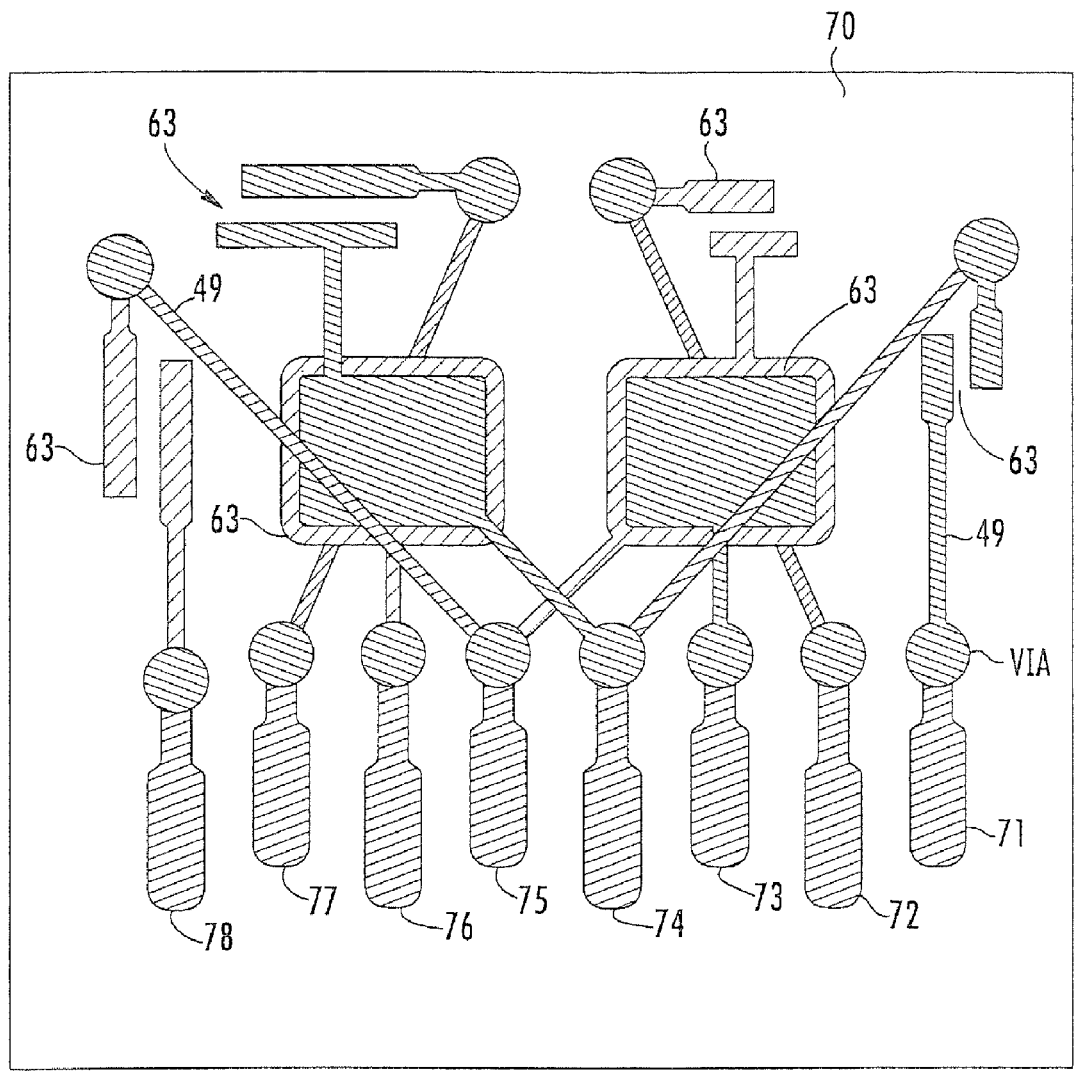
FIG. 8 is a plan view of the horizontally-oriented wiring board of the communications jack of FIG. 2.

As best shown in FIGS. 2 and 3, the communications jack 10 may also include a second, horizontally-oriented wiring board 70 that is supported within the jack housing 11. FIG. 8 is a plan view of one implementation of the horizontally-oriented wiring board 70 according to certain embodiments of the present invention. As shown in FIG. 2, the horizontally-oriented wiring board 70 is positioned above the free ends 23 of the contact wires 20 and beneath the top cover 19. The wiring board 70 has eight contact pads 71-78 arrayed adjacent to a front edge thereof, wherein the pads 71-78 are operatively aligned with corresponding ones of the free ends 23 of the contact wires 20. Capacitance elements 63 for providing capacitive crosstalk compensation are provided on or within layers of the wiring board 70 which are connected to corresponding pairs of the contact pads 71-78. While the embodiment of FIGS. 2-8 described herein includes the horizontally-oriented wiring board 70, it will be appreciated that, in other embodiments of the present invention, this second horizontally-oriented wiring board 70 may be omitted, and the crosstalk compensation that is provided on the second horizontally-oriented wiring board 70 may instead be provided elsewhere such as, for example, on the vertically-oriented wiring board 40.

When a mating plug is received within the plug aperture 18 of jack frame 11 along the direction of plug axis P, contacts of the plug engage the free ends 23 of the contact wires 20 and urge the free ends 23 upward where they mate with a corresponding one of the contact pads 71-78 on the wiring board 70 (note that while in this particular embodiment contact pads are provided on all of the contact wires 20, in other embodiments, contact pads may only be provided for some of the contact wires 20). Capacitive compensation is introduced in wiring board 70 via capacitors 63 that are connected to the contact pads 71-78 on wiring board 70 via conductive traces 49. This capacitive compensation will have a polarity that is generally opposite to the polarity of the crosstalk that is introduced in the mating plug and in the plug contact region of the contacts 20. Note that a first capacitor 63 is provided that connects via respective ones of the contact pads to the free ends 23 of contact wires 20-3 and 20-5, and that a second capacitor 63 is provided that connects via respective ones of the contact pads to the free ends 23 of contact wires 20-4 and 20-6, for the purpose of providing pair 1 to pair 3 differential-to-differential crosstalk compensation. Additional capacitors 63 are provided on horizontally-oriented wiring board 70 to provide capacitive compensation between various other pair combinations. It will also be understood that additional capacitive compensation is introduced on the vertically-oriented wiring board 40. This additional capacitive compensation on wiring board 40 (see FIG. 7) may comprise capacitive compensation elements 61, 62, 63 that have the same polarity as the compensation introduced on the horizontally-oriented wiring board 70 (which is a polarity that is opposite the polarity of the crosstalk introduced in the plug and/or in the plug contact region of the contact wires 20) and/or additional stages of compensation that have generally the opposite polarity as the compensation introduced on the horizontally-oriented wiring board 70 (and hence a polarity that is generally the same as the polarity of the crosstalk introduced in the plug and in the plug contact region of the contact wires 20). In such two-stage crosstalk compensation schemes the crosstalk compensation that is a polarity that is opposite the polarity of the crosstalk introduced in the plug and/or in the plug contact region of the contact wires 20 is generally referred to as "first stage compensation", and the crosstalk compensation that has a polarity that is generally same as the polarity of the crosstalk introduced in the plug and in the plug contact region of the contact wires 20 is referred to as "second stage compensation." First stage compensation introduced on the horizontally-oriented wiring board 70 may be shared with additional first stage compensation in wiring board 40, or wiring board 40 may only contain the second stage compensation, depending on the utilization of wiring board 70. According to one embodiment, when the first stage compensation is located close to apertures 41-48, the second stage compensation will be positioned closer to the IDCs 60. Methods of using such two-stage compensation schemes to reduce crosstalk levels in a communications jack are described in detail in U.S. Pat. No. 5,997,358 to Adriaenssens et al.

The communications jacks 10 according to embodiments of the present invention may provide excellent differential-to-differential and differential-to-common mode crosstalk compensation. With respect to differential-to-differential crosstalk, typically the greatest amount of such crosstalk is generated in the mating plug and in the plug contact region 22 of the contact wires 20 between the pair 1 and the pair 3 signal paths. To compensate for this differential-to-differential crosstalk between pairs 1 and 3, it is desirable to obtain significant levels of both inductive and capacitive crosstalk compensation among the pair 1 and the pair 3 contact wires in the lead frame. As shown best in FIGS. 3 and 5, because of the crossover in the contact wires 20-3, 20-6 of pair 3, contact wires 20-3 and 20-5 are positioned so that the termination ends 27 thereof are in close proximity to each other, and hence will generate compensating inductive crosstalk. This coupling may be designed to compensate for the offending crosstalk that is generated between contact wires 20-3 and 20-4 in the plug contact regions thereof and for crosstalk introduced between the blades in positions 3 and 4 of the mating plug. Likewise, contact wires 20-4 and 20-6 are positioned so that the termination ends 27 thereof are in close proximity to each other, and hence will generate compensating inductive crosstalk. This coupling may be designed to compensate for the offending crosstalk that is generated between contact wires 20-5 and 20-6 in the plug contact regions thereof and for crosstalk introduced between the blades in positions 5 and 6 of the mating plug.

As discussed above, capacitive crosstalk compensation is also provided to compensate for the differential-to-differential crosstalk between pairs 1 and 3. This capacitive crosstalk compensation is introduced at essentially zero delay (which is the equivalent of introducing the capacitive compensation at the plug/jack mating point in the lead frame) by providing capacitive elements 63 on the horizontally-oriented wiring board 70 that are electrically connected to contact wires 20-3 and 20-5 (a first capacitor) and contact wires 20-4 and 20-6 (a second capacitor) when a mating plug is received within the plug aperture 18 in a manner similar to that shown in U.S. Pat. No. 6,350,158 to Arnett et al. The combination of the above-described capacitive crosstalk compensation mechanisms allows the communications jack 10 to provide excellent differential-to-differential crosstalk compensation on the most problematic differential pairs (i.e., pairs 1 and 3). Additionally, by virtue of the large stagger in current carrying tip members of pairs 1, 3, 2 and 4, (contacts 20-5, 20-3, excluding second termination end, 20-1, and 20-7), being positioned in a row above current carrying ring members of pairs 1, 3, 2 and 4, (contacts 20-4, 20-6, excluding second termination end, 20-2, and 20-6), differential-to-differential inductive crosstalk compensation is achieved. In some embodiments, this differential-to-differential inductive crosstalk compensation along with capacitive differential-to-differential compensation within vertically-oriented wiring board 40 may provide sufficient pair 1 to pair 3 differential-to-differential crosstalk compensation. As noted above, in such embodiments, the horizontally-oriented wiring board 70 may be omitted.

The communications jack 10 also provides differential-to-differential crosstalk compensation for various other pair combinations. As can be seen in FIGS. 3 and 5, the second termination end 28 of contact wire 20-3, which is non-current carrying, is positioned closer to the termination end 27 of contact wire 20-1 than it is to the termination end 27 of contact wire 20-2, which provides capacitive differential-to-differential compensation for crosstalk generated between contact wires 20-2 and 20-3 in the plug contact region 22 where contacts wires 20-2 and 20-3 are closely aligned in a side-by-side relationship. Similarly, the second termination end 28 of contact wire 20-6, which is non-current carrying, is positioned closer to the termination end 27 of contact wire 20-8 than it is to the termination end 27 of contact wire 20-7, which provides capacitive compensation for crosstalk generated between contact wires 20-6 and 20-7 in the plug contact region 22 where contacts wires 20-6 and 20-7 are closely aligned in a side-by-side relationship. Note that when coupled members are carrying current they couple both capacitively and inductively, and when they do not carry current they can only couple capacitively.

Additionally, as discussed above, capacitive compensation elements may also be provided on the vertically-oriented wiring board 40. In particular, as shown in FIG. 7, a first capacitive element 61 may be provided on the wiring board 40 that is connected to the second termination end 28 of contact wire 20-3 and to contact wire 20-1 to provide additional crosstalk compensation between pairs 2 and 3 on the tip side. To adjust for balance, as needed, capacitive elements can be connected on the ring side between the second termination end 28 of contact wire 20-6 and contact wire 20-2 (not included in FIG. 7). As current does not flow through the second termination end 28 of contact wires 20-3 and 20-6, this capacitive crosstalk compensation is advantageously introduced at a low delay. Similarly, a second capacitive element 62 may be provided on the wiring board 40 that is connected to the second termination end 28 of contact wire 20-6 and to contact wire 20-8 to provide additional crosstalk compensation between pairs 3 and 4 on the ring side. As current does not flow through the second termination end 28 of contact wire 20-6, this capacitive crosstalk compensation is also introduced at essentially zero delay. Similar compensation (not included in FIG. 7) can be introduced on the tip side contacts as needed for balance. As shown in FIG. 7, various other crosstalk compensation structures 63, including both capacitive and inductive structures and first and second stage compensation structures, may be provided on the wiring board 40. Capacitive compensation structures 63 are also provided on wiring board 70. Inductive compensation on wiring board 70 cannot be accomplished in this particular embodiment since current carrying paths are not provided on wiring board 70.

In addition to providing differential-to-differential crosstalk compensation, the communications jack 10 can also provide excellent differential-to-common mode crosstalk compensation. Due to the large physical separation between both pair 2 and pair 4 and one of the conductors of pair 3, the highest levels of differential-to-common mode crosstalk, which can be the most problematic to channel performance, tend to occur on pairs 2 and 4 when pair 3 is excited differentially. The differential-to-common mode crosstalk occurring when any of the pairs 1, 2 and 4 is excited differentially tends to be much less severe, and consequently much less problematic, because the separation between the contact wires in each of these pairs is one-third the separation between the contact wires of pair 3. Because of the crossover in the contact wires 20-3 and 20-6 of pair 3, the communications jack 10 can provide inductive crosstalk compensation for the differential-to-common mode crosstalk that occurs on pairs 2 and 4 when pair 3 is differentially excited. Because the most problematic differential-to-common mode crosstalk can be inductively compensated, a communications jack employing this arrangement can meet higher performance standards, particularly at elevated frequencies. By virtue of the relatively large stagger and crossovers in pairs 3, 2 and 4, inductive differential-to-differential crosstalk compensation between pairs 3 and 2 and between pairs 3 and 4 is also attained simultaneously. The large stagger between pair 3 and pair 1 also introduces compensation to minimize the historically problematic differential-to-differential crosstalk that occurs with this pair combination.

EXAMPLE 1

Calculations have been performed to estimate the differential-to-differential and differential-to-common mode crosstalk values that can be achieved using the communications jack of FIGS. 2-8. Table 1 below lists the differential-to-differential and differential-to-common mode crosstalk values that are generated in the "in-line" portion of the contact wires 20 that includes the plug contact region of each contact. Note that the in-line geometry and the resulting crosstalk is also common to that occurring in typical communication plugs. The values are provided in terms of mV/V/inch, and hence the total crosstalk values may be computed by multiplying the values in Table 1 by the length of the in-line portion of the contacts. Crosstalk between pairs 2 and 4 were not calculated as these levels are typically quite low due to the large physical separation between the contact wires of pairs 2 and 4. In Table 1, "XL" represents the inductive crosstalk between the identified pairs, "XC" represents the capacitive crosstalk between the identified pairs and "Total" represents the sum of XL and XC. All tabulated inductive responses (XL) were derived using calculations that assumed magnetic coupling between line filaments, and tabulated capacitive responses (XC) used calculations based on capacitive coupling between circular wires having circumference equivalent to actual 10×17 mil cross-sections. (Equation references are in Walker, *Capacitance, Inductance, and Crosstalk Analysis*, Sections 2.2.8 and 2.3.8). The latter calculations are approximate because shielding effects are not taken into consideration. Further, differential-to-common mode responses assume a common mode impedance of 75 ohms, a value whose absolute value need not be exact for this purpose. Tables 2 and 3 below use the same conventions as Table 1.

TABLE 1

In-Line Section Crosstalk

| Differential Pairs | Differential-to-Differential NEXT | | | Differential-to-Common Mode NEXT | | |
|---|---|---|---|---|---|---|
| | XL | XC | Total | XL | XC | Total |
| 1 to 2 | 1.85 | 0.55 | 2.40 | −5.38 | −0.88 | −6.26 |
| 1 to 3 | −21.65 | −3.76 | −25.01 | 0 | 0 | 0 |
| 1 to 4 | 1.85 | 0.55 | 2.40 | 5.38 | 0.88 | 6.26 |
| 2 to 1 | 1.85 | 0.55 | 2.40 | −5.38 | −0.88 | −6.26 |
| 2 to 3 | −7.38 | −1.27 | −8.65 | −7.13 | −1.87 | −9.00 |
| 3 to 1 | −21.65 | −3.76 | −25.01 | 0 | 0 | 0 |
| 3 to 2 | −7.38 | −1.27 | −8.65 | 17.78 | 3.51 | 21.29 |
| 3 to 4 | −7.38 | −1.27 | −8.65 | −17.78 | −3.51 | −21.29 |
| 4 to 1 | 1.85 | 0.55 | 2.40 | 5.38 | 0.88 | 6.26 |
| 4 to 3 | −7.38 | −1.27 | −8.65 | 7.13 | 1.87 | 9.00 |

As shown in Table 1, the differential-to-common mode crosstalk levels for pair 3 to pair 2 and for pair 3 to pair 4 are comparatively large (a magnitude of 21.29 mV/V/inch), indicating a large unbalance for these pair combinations. The differential-to-common mode crosstalk levels for pair 1 to pair 2 and for pair 2 to pair 1, pair 1 to pair 4 and pair 4 to pair 1 are also unbalanced, but to a lesser extent. The large differential-to-differential crosstalk between pair 1 and pair 3 (magnitude of 25.01) is also evident. Such large levels of both types of crosstalk resulting from the in-line geometry is also common to typical communication plugs and, historically, has been the significant source of unwanted crosstalk.

Table 2 provides the differential-to-differential and differential-to-common mode crosstalk values calculated using this approach that are provided in the back part of the lead frame (i.e., between the contact terminations and the crossover region). As shown in Table 2, the differential-to-differential crosstalk between pair 1 and pair 3, between pair 2 and pair 3, and between pair 3 and pair 4 each have polarities that are opposite to the polarities of the crosstalk between those pair combinations that is generated in the in-line portion of the contacts, as can be seen from Table 1. As such, Table 2 shows that the lead frame provides differential-to-differential crosstalk compensation for each of these pair combinations. While the crosstalk between pair 1 and to pair 2 and between pair 1 to pair 4 have the same polarity as that in Table 1, the overall levels are small and not problematic. Also as shown in Table 2, the differential-to-common mode crosstalk on pair 2 to pair 1, pair 2 to pair 3, pair 3 to pair 2, pair 3 to pair 4, pair 4 to pair 1 and pair 4 to pair 3 have the opposite polarity as is shown in Table 1, and hence provide compensating crosstalk.

As the pair 3 to 2 and pair 3 to 4 differential-to-common mode crosstalk is kept at relatively low levels, improved alien crosstalk performance may be obtained as compared to prior art jacks. While the pair 1 to pair 2 and pair 1 to pair 4 values have the same polarity as shown in Table 1, and hence are non-compensating, the overall levels on these pair combinations are manageable. Hence, Table 2 illustrates how the communications connectors according to embodiments of the present invention can be designed to provide improved differential-to-differential and differential-to-common mode crosstalk compensation.

TABLE 2

Crosstalk in remainder of Lead Frame

| Differential Pairs | Differential-to-Differential NEXT | | | Differential-to-Common Mode NEXT | | |
|---|---|---|---|---|---|---|
| | XL | XC | Total | XL | XC | Total |
| 1 to 2 | 5.87 | 0.71 | 6.58 | −3.85 | −0.51 | −4.36 |
| 1 to 3 | 32.79 | 3.21 | 36.00 | 0 | 0 | 0 |
| 1 to 4 | 5.87 | 0.71 | 6.58 | 3.85 | 0.51 | 4.36 |
| 2 to 1 | 5.87 | 0.71 | 6.58 | 4.06 | 0.55 | 4.61 |
| 2 to 3 | 10.31 | 2.13 | 12.44 | 0.52 | 1.81 | 2.33 |
| 3 to 1 | 32.79 | 3.31 | 36.00 | 0 | 0 | 0 |
| 3 to 2 | 10.31 | 2.13 | 12.44 | −11.41 | −1.70 | −9.71 |
| 3 to 4 | 10.31 | 2.13 | 12.44 | 11.41 | 1.70 | 9.71 |
| 4 to 1 | 5.87 | 0.71 | 6.58 | −4.06 | −0.55 | −4.61 |
| 4 to 3 | 10.31 | 2.13 | 12.44 | −0.52 | −1.81 | −2.33 |

In another embodiment of the present invention, the contact wire arrangement of FIG. 3 is modified by positioning the termination end 27 of contact wire 20-4 of pair 1 10 mils closer (in the horizontal or "x" direction of FIG. 5) to the termination end 27 of contact wire 20-1 of pair 2 and positioning termination end 27 of contact wire 20-5 of pair 1 10 mils closer (in the horizontal or "x" direction of FIG. 5) to the termination end 27 of contact wire 20-8 of pair 4. This modified contact wire arrangement leads to slightly improved balance between pairs 1 and 2 and between pairs 1 and 4 (and hence improved differential-to-common mode crosstalk on pair 2 and pair 4 when pair 1 is excited differentially). It is, however, at the small expense of the pair 1 to pair 3 differential-to-differential (hence pair 3 to pair 1) crosstalk compensation. (28.37 vs. 36.0). Table 3 below provides the differential-to-differential and differential-to-common mode crosstalk values calculated using this modified lead frame. Crosstalk between pairs 2 and 4 were not calculated as these levels are typically quite low due to the large physical separation between the contact wires of pairs 2 and 4.

TABLE 3

Crosstalk in Remainder of Modified Lead Frame

| Differential Pairs | Differential-to-Differential NEXT | | | Differential-to-Common Mode NEXT | | |
|---|---|---|---|---|---|---|
| | XL | XC | Total | XL | XC | Total |
| 1 to 2 | 6.28 | 0.78 | 7.06 | −1.74 | −0.20 | −1.94 |
| 1 to 3 | 25.50 | 2.88 | 28.37 | 0 | 0 | 0 |
| 1 to 4 | 6.28 | 0.78 | 7.06 | 1.74 | 0.20 | 1.94 |
| 2 to 1 | 6.28 | 0.78 | 7.06 | 4.51 | 0.63 | 5.14 |
| 2 to 3 | 10.31 | 2.13 | 12.44 | 0.52 | 1.81 | 2.33 |
| 3 to 1 | 25.50 | 2.88 | 28.37 | 0 | 0 | 0 |
| 3 to 2 | 10.31 | 2.13 | 12.44 | −11.41 | −1.70 | −9.71 |
| 3 to 4 | 10.31 | 2.13 | 12.44 | 11.41 | 1.70 | 9.71 |
| 4 to 1 | 6.28 | 0.78 | 7.06 | −4.51 | −0.63 | −5.14 |
| 4 to 3 | 10.31 | 2.13 | 12.44 | −0.52 | −1.81 | −2.33 |

Numerous additional modifications may be made to the communications jack of FIGS. 2-8 without departing from the scope of the present invention. As one example, although eight contact wires are provided in the communications jack 10, other numbers of contact wires may be employed. For example, 16 contact wires may be employed, and one or more crossovers that cross over a pair of contact wires that are sandwiched therebetween may be included in those contact wires. Likewise, other configurations of jack frames, covers and IDC housings may be used in further embodiments of the present invention. As another example, the contact wires may have a different profile and/or the contact wires may be mounted in a different pattern on the vertically-oriented wiring board. Similarly, the IDCs may be mounted in a different pattern on the wiring board and/or some other type of connection terminals may be used in place of IDCs. In some embodiments, the crossovers on pairs 2 and 4 may be omitted and/or may be placed on the vertically-oriented wiring board instead of in the contact wires. Additionally, interdigitated finger capacitors or other capacitive elements could be used on the vertically-oriented and/or horizontally-oriented wiring boards instead of the plate capacitors that are primarily used in the embodiments of FIGS. 2-8.

As a further example, the communications jacks may be employed within a patch panel or series of patch panels as opposed to comprising a stand-alone communications jack. Likewise, the second termination ends of the contact wires of pair 3 may be located in different positions on the wiring board than those shown in the exemplary embodiment depicted above. The vertical stagger on pair 3 may also be further or less exaggerated and, in some embodiments, the contact wires of pair 1 may have a larger vertical stagger than the contact wires of pair 3.

In the claims appended hereto, as well as in the summary section above, it will be understood that the terms "first", "second", "third" and the like, when used in reference to a contact wire, conductor, differential pair or the like, are not necessarily being used to refer to a specific contact wire, conductor or differential pair as specified in, for example, the TIA/EIA 568, type B configuration, but instead are used merely to distinguish one contact wire, conductor or differential pair from other contact wires, conductors or differential pairs that are recited in the claim. Thus, for example, a "first contact wire" that is referenced in the claims may refer to any contact wire in the TIA/EIA 568, type B configuration, or may refer to a contact wire according to some other configuration.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications jack, comprising:
 a housing having a plug aperture that is configured to receive a mating plug that is inserted along a horizontal plug axis;
 a generally vertically-oriented wiring board that is mounted substantially normal to the horizontal plug axis;

a first contact wire and a second contact wire that form a first differential pair of contact wires, the first and second contact wires each having a fixed portion that is mounted in the vertically-oriented wiring board and a deflectable portion that is at least partially positioned in the plug aperture; and a third contact wire and a fourth contact wire that form a second differential pair of contact wires, the third and fourth contact wires each having a fixed portion that is mounted in the vertically-oriented wiring board and a deflectable portion that is at least partially positioned in the plug aperture;

wherein at least a portion of the first differential pair of contact wires is positioned between the contact wires of the second differential pair of contact wires in a plane that is normal to the vertically-oriented wiring board;

wherein the deflectable portions of the third and fourth contact wires include a crossover;

wherein the fixed portions of the third and fourth contact wires are spaced farther apart vertically than are the fixed portions of the first and second contact wires.

2. The communications jack of claim 1, further comprising a fifth contact wire and a sixth contact wire that form a third differential pair of contact wires and a seventh contact wire and eighth contact wire that form a fourth differential pair of contact wires, wherein each of the fifth through eighth contact wires includes a fixed portion that is mounted in the vertically-oriented wiring board and a deflectable portion that is at least partially positioned in the plug aperture, and wherein the third differential pair of contact wires includes a crossover and the fourth differential pair of contact wires includes a crossover.

3. The communications jack of claim 2, further comprising a second wiring board that includes a plurality of contact pads, and wherein the deflectable portion of at least some of the first through eighth contact wires are configured to make physical and electrical contact with respective of the contact pads when the mating plug is received within the plug aperture.

4. The communications jack of claim 1, further comprising a fifth contact wire and a sixth contact wire that form a third differential pair of contact wires and a seventh contact wire and eighth contact wire that form a fourth differential pair of contact wires, wherein each of the fifth through eighth contact wires includes a fixed portion that is mounted in the vertically-oriented wiring board and a deflectable portion that is at least partially positioned in the plug aperture.

5. The communications jack of claim 4, wherein the third contact wire and the fourth contact wire each include a second fixed portion that is mounted in the vertically-oriented wiring board.

6. The communications jack of claim 5, wherein the each of the third contact wire and the fourth contact wire includes a first longitudinal segment that includes the fixed portion, a second longitudinal segment that includes the second fixed portion, a third longitudinal segment that includes a plug contact region that is configured to make electrical contact with a contact of a mating plug, and a transverse segment that connects the first, second and third longitudinal segments.

7. The communications jack of claim 5, wherein the transverse segment of the third contact wire crosses the first and second contact wires and at least one of the fifth through eighth contact wires, and wherein the transverse segment of the fourth contact wire crosses the first and second contact wires and at least one of the fifth through eighth contact wires.

8. The communications jack of claim 5, wherein the fixed portions of the second, third, fifth and seventh contact wires and the second fixed portion of the third contact wire are at least generally aligned in a first row, and the fixed portions of the first, forth, sixth and eighth contact wires and the second fixed portion of the fourth contact wire are generally aligned in a second row that is below the first row, and wherein the second fixed portion of the third contact wire is on one end of the first row and the second fixed portion of the fourth contact wire is on one end of the second row.

9. The communications jack of claim 8, wherein the fixed portion and the second fixed portion of the third contact wire are mounted above the fixed portions of the second and fifth contact wires, and wherein the fixed portion and the second fixed portion of the fourth contact wire are mounted below the fixed portions of the first and eighth contact wires.

10. The communications jack of claim 2, wherein the vertically-oriented wiring board includes a metal-plated hole that receives the second fixed portion of the third contact wire and a capacitor that is directly connected to the metal-plated hole or is connected to the metal-plated hole via a conductive trace on or in the vertically-oriented wiring board.

11. A communications jack, comprising:
a housing having a plug aperture that is configured to receive a mating plug that is inserted along a first axis;
a wiring board that is mounted substantially perpendicular to the first axis;
a first contact wire that has a termination end that is mounted in the wiring board and a free end that includes a plug contact region;
a second contact wire that has a termination end that is mounted in the wiring board and a free end that includes a plug contact region;
a third contact wire that has a first termination end that is mounted in the wiring board, a second termination end that is mounted in the wiring board, a crossover segment that connects the first and second termination ends and a free end that includes a plug contact region;
a fourth contact wire that has a termination end that is mounted in the wiring board and a free end that includes a plug contact region;
a fifth contact wire that has a termination end that is mounted in the wiring board and a free end that includes a plug contact region;
a sixth contact wire that has a first termination end that is mounted in the wiring board, a second termination end that is mounted in the wiring board, a crossover segment that connects the first and second termination ends and a free end that includes a plug contact region;
a seventh contact wire that has a termination end that is mounted in the wiring board and a free end that includes a plug contact region;
an eighth contact wire that has a termination end that is mounted in the wiring board and a free end that includes a plug contact region;
wherein the fourth contact wire and the fifth contact wire form a first differential pair of contact wires;
wherein the first contact wire and the second contact wire form a second differential pair of contact wires;
wherein the third contact wire and the sixth contact wire form a third differential pair of contact wires;
wherein the seventh contact wire and the eighth contact wire form a fourth differential pair of contact wires;
wherein the plug contact regions of the first through eighth contact wires are arranged in a generally side-by-side relationship in numerical order;
wherein the third contact wire crosses at least the fourth, fifth and sixth contact wires; and wherein the sixth contact wire crosses at least the third, fourth and fifth contact wires.

12. The communications jack of claim 11, wherein the crossover segment of the third contact wire is substantially perpendicular to the first termination end of the third contact wire and to the second termination end of the third contact wire.

13. The communications jack of claim 11, wherein the termination ends of the first, fifth and seventh contact wires and the first and second termination ends of the third contact wire are generally aligned in a first row, and wherein the termination ends of the second, fourth and eighth contact wires and the first and second termination ends of the sixth contact wire are generally aligned in a second row that is vertically spaced apart from the first row.

14. The communications jack of claim 13, wherein the first termination end of the third contact wire is part of the signal carrying path through the jack and the second termination end of the third contact wire is mounted in a metal-plated hole on the wiring board that is connected to a capacitor on the wiring board.

15. The communications jack of claim 13, wherein the second termination end of the third contact wire is at a first end of the first row and the second termination end of the sixth contact wire is at a first end of the second row that is opposite the first end of the first row.

16. The communications jack of claim 11, wherein a surface of the wiring board into which the first through fourth contact wires are mounted defines an x-y plane, wherein the first termination end of the third contact wire and the first termination end of the sixth contact wire are spaced apart a first distance in the x-direction and a second distance in the y-direction, wherein the termination end of the fourth contact wire and the termination end of the fifth contact wire are spaced apart by a third distance in the x-direction and a fourth distance in the y-direction, and wherein the first distance exceeds the third distance and the second distance exceeds the fourth distance.

17. The communications jack of claim 11, wherein the second differential pair of contact wires includes a crossover and the fourth differential pair of contact wires includes a crossover.

18. A contact wire that is suitable for use in an RJ-45 communications jack, comprising:
   a first termination end having a press-fit termination;
   a second termination end having a press-fit termination;
   a crossover section that connects the first termination end and the second termination end; and
   a longitudinal segment that includes a free end and a plug contact region that is configured to make physical and electrical contact with a contact of a mating plug connector, the longitudinal segment extending from the crossover section.

19. The contact wire of claim 18, wherein the first termination end, the second termination end and the longitudinal segment are generally parallel to each other.

20. The contact wire of claim 18, wherein the crossover section is generally perpendicular to the longitudinal segment.

21. The contact wire of claim 18, wherein the longitudinal segment extends from an intermediate portion of the crossover section.

22. The contact wire of claim 18, wherein a first distance along the contact wire from the press-fit termination of the first termination end to the crossover section is substantially the same as a second distance along the contact wire from the press-fit termination of the second termination end to the crossover section.

\* \* \* \* \*